United States Patent
Tsujimoto

(10) Patent No.: US 7,569,478 B2
(45) Date of Patent: Aug. 4, 2009

(54) METHOD AND APPARATUS FOR MANUFACTURING SEMICONDUCTOR DEVICE, CONTROL PROGRAM AND COMPUTER STORAGE MEDIUM

(75) Inventor: Hiroshi Tsujimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 11/500,416

(22) Filed: Aug. 8, 2006

(65) Prior Publication Data

US 2007/0049013 A1 Mar. 1, 2007

Related U.S. Application Data

(60) Provisional application No. 60/718,297, filed on Sep. 20, 2005.

(30) Foreign Application Priority Data

Aug. 25, 2005 (JP) ............................. 2005-243973

(51) Int. Cl.
*H01L 21/4763* (2006.01)

(52) U.S. Cl. .................. 438/624; 438/625; 438/642; 438/656; 438/725; 438/745; 257/E21.027; 257/E21.256; 257/E21.259; 257/E21.579

(58) Field of Classification Search .................. 438/637, 438/780, 624, 625, 639, 642, 656, 688, 706, 438/725, 745, 949; 257/E21.027, 256, 259; 257/579, 586
See application file for complete search history.

(56) References Cited

U.S. PATENT DOCUMENTS

| | | | | |
|---|---|---|---|---|
| 4,666,556 A | * | 5/1987 | Fulton et al. ................. | 438/431 |
| 6,165,898 A | * | 12/2000 | Jang et al. .................... | 438/638 |
| 6,168,726 B1 | * | 1/2001 | Li et al. ......................... | 216/79 |
| 6,204,166 B1 | * | 3/2001 | McTeer ....................... | 438/624 |
| 6,350,435 B1 | * | 2/2002 | Alvarez Hernandez ....... | 424/48 |
| 6,372,636 B1 | * | 4/2002 | Chooi et al. ................. | 438/639 |
| 6,686,293 B2 | * | 2/2004 | Kim et al. .................... | 438/711 |
| 6,800,551 B2 | * | 10/2004 | Nagahara et al. ............ | 438/638 |
| 6,855,629 B2 | * | 2/2005 | Kim et al. .................... | 438/637 |
| 6,913,994 B2 | * | 7/2005 | Guo et al. .................... | 438/638 |
| 7,030,028 B2 | * | 4/2006 | Mori et al. .................. | 438/712 |
| 7,192,863 B2 | * | 3/2007 | Zhijian et al. ............... | 438/637 |

(Continued)

FOREIGN PATENT DOCUMENTS

JP 2001-135630 5/2001

(Continued)

*Primary Examiner*—Michael S Lebentritt
(74) *Attorney, Agent, or Firm*—Oblon, Spivak, McClelland, Maier & Neustadt, P.C.

(57) ABSTRACT

In a method for manufacturing a semiconductor device having a dual damascene structure, a semiconductor substrate formed by stacking a trench mask and a via hole resist mask on an insulating film is loaded into a processing chamber, and a via hole is formed by etching the insulating film through the via hole resist mask. Then, the via hole resist mask is removed by an ashing process and a protective film is formed on an underlayer of the insulating film; Thereafter, a trench is formed by etching the insulating film through the trench mask, and the semiconductor substrate is unloaded from the processing chamber after the via hole forming step, the resist mask removing step, the protective film forming step and the trench forming step are completed in the processing chamber.

10 Claims, 3 Drawing Sheets

U.S. PATENT DOCUMENTS

| | | | |
|---|---|---|---|
| 7,205,225 B2 * | 4/2007 | Furukawa | 438/624 |
| 2001/0008226 A1 * | 7/2001 | Hung et al. | 216/18 |
| 2004/0005789 A1 | 1/2004 | Jiwari et al. | |
| 2004/0058538 A1 | 3/2004 | Park et al. | |
| 2004/0072430 A1 * | 4/2004 | Huang et al. | 438/689 |

FOREIGN PATENT DOCUMENTS

| | | |
|---|---|---|
| JP | 2004-111950 | 4/2004 |

* cited by examiner

METHOD AND APPARATUS FOR MANUFACTURING SEMICONDUCTOR DEVICE, CONTROL PROGRAM AND COMPUTER STORAGE MEDIUM

FIELD OF THE INVENTION

The present invention relates to a method and an apparatus for manufacturing a semiconductor device having a dual damascene structure, a control program and a computer storage medium.

BACKGROUND OF THE INVENTION

Recently, a semiconductor device manufacturing process has employed a dual damascene process in which a via contact and a wiring are simultaneously formed by filling a metal such as copper or the like into a via hole and a trench formed on a semiconductor substrate.

As for the aforementioned dual damascene process, there is known a method for forming a via contact and a wiring through following processes (see Japanese Patent Laid-open Application No. 2004-111950, for example). In such method, first of all, a via hole is formed by etching an insulating film with a via resist mask. Next, a residual resist mask is removed by ashing and, then, a protective film for protecting an underlayer disposed at the bottom of the via hole is formed by a chemical vapor deposition using a CVD or the like. Thereafter, a trench resist mask is formed by performing a photoresist coating process using a coater, an exposure process using an exposure device, a developing process using a developing apparatus or the like. Next, a wiring trench is formed by an etching process using the trench resist mask and, then, the residual resist mask, and the protective film are removed by an ashing process and an etching process or the like.

With the aforementioned processes, a via hole and a trench are formed and, then, a metal such as copper or the like is filled into the via hole and the trench by using a plating unit or the like. Thereafter, by polishing the surface with a chemical mechanical polishing (CMP) or the like, the metal on an area where the trench is not formed is removed to form a via contact and a wiring.

In the conventional method described above, however, an etching apparatus, a CVD apparatus, or an ashing apparatus is needed to execute a plurality of steps for performing a dual damascene process. Moreover, a semiconductor wafer may need to be cleaned in the steps, which results in an extended time of manufacturing process.

SUMMARY OF THE INVENTION

It is, therefore, an object of the present invention to provide a semiconductor device manufacturing method and apparatus capable of shortening time required for manufacturing a semiconductor device compared with the conventional ones, a control program and a computer storage medium.

In accordance with one aspect of the invention, there is provided a method for manufacturing a semiconductor device having a dual damascene structure, the method including the steps of: loading a semiconductor substrate formed by stacking a trench mask and a via hole resist mask on an insulating film into a processing chamber; forming a via hole by etching the insulating film with the use of the via hole resist mask; removing the via hole resist mask by an ashing process; forming on an underlayer of the insulating film a protective film having an organic material for protecting the underlayer serving as a bottom of the via hole; forming a trench by etching the insulating film with the use of the trench mask; and unloading the semiconductor substrate from the processing chamber after the via hole forming step, the resist mask removing step, the protective film forming step and the trench forming step are completed in the processing chamber.

Preferably, the via hole forming step, the resist mask removing step, the protective film forming step and the trench forming step are sequentially carried out in the processing chamber.

In accordance with still another aspect of the invention, there is provided a method for manufacturing a semiconductor device having a dual damascene structure, the method including the steps of: loading a semiconductor substrate formed by stacking a trench mask and a via hole resist mask on an insulating film into a processing chamber; forming a via hole by etching the insulating film with the use of the via hole resist mask; removing the via hole resist mask by an ashing process; forming on an underlayer of the insulating film a protective film having an organic material for protecting the underlayer serving as a bottom of a via hole; forming a trench by etching the insulating film with the help of the trench mask; removing a residual protective film by an ashing process; and unloading the semiconductor substrate from the processing chamber after the via hole forming step, the resist mask removing step, the protective film forming step, the trench forming step and the protective film removing step are completed in the processing chamber.

Preferably, the via hole forming step, the resist mask removing step, the protective film forming step, the trench forming step and the protective film removing step are sequentially carried out in the processing chamber.

Preferably, the protective film forming step includes depositing the protective film and removing the protective film deposited on an area other than the inside of the via hole by an ashing process.

Preferably, the protective film is deposited by using $C_xF_y$ gas or $C_xH_yF_z$ gas.

Preferably, the processing chamber has an upper and a lower electrodes facing each other, and high frequency powers are applicable to the upper and the lower electrodes, respectively.

In accordance with still another aspect of the invention, there is provided an apparatus for manufacturing a semiconductor device, the apparatus including: a processing chamber for accommodating therein a semiconductor substrate; a processing gas supply unit for supplying a processing gas into the processing chamber; a plasma generating unit for converting the processing gas supplied from the processing gas supply unit into a plasma to perform a plasma process on the semiconductor substrate; and a control unit for controlling the semiconductor device manufacturing apparatus to perform the aforementioned semiconductor device manufacturing method in the processing chamber.

In accordance with still another aspect of the invention, there is provided a control program executed in a computer, for controlling the semiconductor device manufacturing apparatus to perform the semiconductor device manufacturing method.

In accordance with still another aspect of the invention, there is provided a storage medium for storing therein a control program executed in a computer, wherein the control program controls the semiconductor device manufacturing apparatus to perform the aforementioned semiconductor device manufacturing method.

In accordance with the present invention, it is possible to comparatively shorten time required for manufacturing a semiconductor device.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1A:
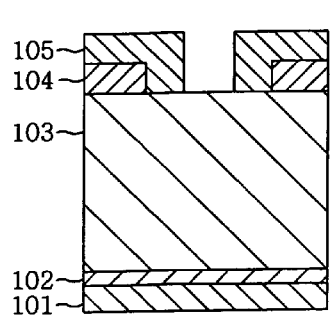
FIG. 1 shows sectional views of a semiconductor wafer subjected to an etching method in accordance with a preferred embodiment of the present invention.

Hereinafter, preferred embodiments of the present invention will be described with reference to the accompanying drawings. FIGS. 1A to 1G show enlarged sectional views of a semiconductor wafer (semiconductor substrate) in a semiconductor device manufacturing method in accordance with a preferred embodiment of the present invention; and FIG. 2 illustrates a configuration of a plasma processing apparatus as a semiconductor manufacturing apparatus in accordance with a preferred embodiment of the present invention. First, the configuration of the plasma processing apparatus will be described with reference to FIG. 2.

A plasma processing apparatus 1 is configured as a capacitively coupled parallel plate type etching apparatus having electrode plates vertically disposed parallel to each other, the electrode plates being connected to plasma generating power supplies.

Further, the plasma processing apparatus 1 includes a grounded cylindrical processing chamber (processing vessel) 2 made of, e.g, aluminum whose surface is anodically oxidized. An approximately columnar susceptor support 4 for mounting thereon an object to be processed, e.g., a semiconductor wafer W, is provided on a bottom portion of the processing chamber 2 via an insulating plate 3 made of ceramic or the like. Further, a susceptor 5 serving as a lower electrode is provided on the susceptor support 4. Moreover, a high pass filter (HPF) 6 is connected with the susceptor 5.

The susceptor support 4 has therein a coolant passageway 7. A coolant is introduced into the coolant passageway 7 through a coolant introducing line 8 and circulates therein. Accordingly, a cold heat is thermally transferred to the semiconductor wafer W via the susceptor 5, thereby controlling the semiconductor wafer W at a desired temperature.

The susceptor 5 is formed in a circular plate shape having a protruded upper central portion and an electrostatic chuck 11 whose shape is approximately the same as that of the semiconductor wafer W is provided thereon. The electrostatic chuck 11 has a composition in which an electrode 12 is embedded in an insulating material. Moreover, by applying a DC voltage of, e.g, 1.5 kV from a DC power supply 13 connected to the electrode 12 to the electrostatic chuck 11, the semiconductor wafer W is electrostatically adsorbed by the Coulomb force, for example.

Formed through the insulating plate 3, the susceptor support 4, the susceptor 5 and the electrostatic chuck 11 is a gas channel 14 for supplying a heat transfer medium (e.g., He gas or the like) to a backside of the semiconductor wafer W. Accordingly, a cold heat of the susceptor 5 is transferred to the semiconductor wafer W via the heat transfer medium, thereby maintaining the wafer W at a desired temperature.

An annular focus ring 15 is disposed at an upper peripheral portion of the susceptor 5 to surround the semiconductor wafer W mounted on the electrostatic chuck 11. The focus ring 15 is made of a conductive material, e.g., silicon or the like, and serves to improve an etching uniformity.

An upper electrode 21 is provided above the susceptor 5 to face it in parallel. The upper electrode 21 is supported at an upper portion of the processing chamber 2 via an insulating material 22. Further, the upper electrode 21 includes an electrode plate 24 having a surface facing the susceptor 5 and a plurality of gas injection openings 23, the electrode plate 24 having an anodically oxidized (alumite treated) aluminum surface provided with a quartz cover; and an electrode support 25 made of a conductive material, for supporting the electrode plate 24. A gap between the susceptor 5 and the upper electrode 21 is controllable.

A gas inlet opening 26 is provided at a central portion of the electrode support 25 in the upper electrode 21. Further, a gas supply line 27 is connected with the gas inlet opening 26. Furthermore, a processing gas supply source 30 is connected with the gas supply line 27 via a valve 28 and a mass flow controller 29. The processing gas supply source 30 supplies plasma processing gases such as an etching gas, an ashing gas, a protective film deposition gas and the like.

A gas exhaust line 31 is connected to a bottom portion of the processing chamber 2, and a gas evacuation unit 35 is connected with the gas exhaust line 31. The gas exhaust unit 35 has a vacuum pump such as a turbo molecular pump or the like and evacuates the processing chamber 2 to a specific depressurized atmosphere, e.g., to a pressure of 1 Pa or less. Moreover, a gate valve 32 is provided on a sidewall of the processing chamber 2. By opening the gate valve 32, the semiconductor wafer W can be transferred between the processing chamber 2 and an adjacent load-lock chamber (not shown).

A first high frequency power supply 40 is connected with the upper electrode 21, and a matching unit 41 is disposed on a power feed line. Further, a low pass filter (LPF) 42 is connected with the upper electrode 21. The first high frequency power supply 40 has a frequency range of 50 to 150 MHz. By applying a high frequency power of the above frequency range, a desirably dissociated high density plasma can be formed in the processing chamber 2.

A second high frequency power supply 50 is connected with the susceptor 5 serving as the lower electrode, and a matching unit 51 is disposed on a power feed line therebetween. Further, the second high frequency power supply 50 has a frequency range lower than that of the first high frequency power supply 40. By applying a high frequency power of the above frequency range, a proper ionic action can take place without inflicting damages to the semiconductor wafer W as an object to be processed. The frequency of the second high frequency power supply 50 preferably ranges from 1 to 20 MHz.

An entire operation of the plasma processing apparatus 1 configured as described above is controlled by a control unit 60. The control unit 60 includes a process controller 61 having a CPU, for controlling each unit in the plasma processing apparatus 1; a user interface 62; and a storage unit 63.

The user interface 62 includes a keyboard for allowing a process manager to input a command for managing the plasma processing apparatus 1, a display unit for visualizing thereon an operation status of the plasma processing apparatus 1, and the like.

The storage unit 63 stores therein recipes containing control programs (software) for implementing various processes in the plasma processing apparatus 1 under the control of the process controller 61, data on processing conditions, and the like. Further, if necessary, a recipe is read from the storage unit 63 in accordance with an instruction from the user interface 62 or the like and then executed by the process controller 61, thereby implementing a desired process in the plasma processing apparatus 1 under the control of the process controller 61. Furthermore, the recipes such as the control programs, the data on processing conditions and the like can be read from a computer-readable storage medium (e.g., a hard disk, a CD, a flexible disk, a semiconductor memory or the like) or transmitted on-line from another system via, e.g., a dedicated line, as desired.

In order to form a via hole and a trench for a dual damascene structure on the semiconductor wafer W with the plasma processing apparatus 1 configured as described above, first, after the gate valve 32 is opened, the semiconductor wafer W is loaded from a load-lock chamber (not shown) into the processing chamber 2 to be mounted on the electrostatic chuck 11. Then, the semiconductor wafer W is electrostatically adsorbed on the electrostatic chuck 11 by applying a DC voltage from the high voltage DC power supply 13. Next, the gate valve 32 is closed and, then, an inner space of the processing chamber 2 is evacuated to a specific vacuum level by the gas evacuation unit 35.

Thereafter, by opening the valve 28, a specific processing gas is introduced from the processing gas supply source 30 into a hollow portion of the upper electrode 21 via the gas supply line 27 and the gas inlet opening 26 while its flow rate is controlled by the mass flow controller 29, and is then uniformly discharged through the gas injection openings 23 of the electrode plate 24, as indicated by the arrows in FIG. 2.

Further, a pressure inside the processing chamber 2 is maintained at a specific level. Next, a high frequency power of a specific frequency is applied from the first high frequency power supply 40 to the upper electrode 21. Accordingly, a high frequency electric field is generated between the upper electrode 21 and the susceptor 5 serving as the lower electrode, thereby dissociating the processing gas into a plasma.

In the meantime, a high frequency power of a lower frequency range than that of the first high frequency power supply 40 is applied from the second high frequency power supply 50 to the susceptor 5 serving as a lower electrode. Accordingly, ions in the plasma are drawn toward the susceptor 5 and, therefore, an etching anisotropy increases due to an ion assist effect. In case the ion attraction is unnecessary in a protective film deposition process or the like, the application of the high frequency power to the susceptor 5 is reduced or eliminated.

Once a series of processes to be described later are completed, the supply of the high frequency power and the supply of the processing gas are stopped and, then, the semiconductor wafer W is unloaded from the processing chamber 2 in a reverse sequence to that described above.

Hereinafter, a method for manufacturing a semiconductor wafer having a dual damascene structure in accordance with this embodiment will be described with reference to FIG. 1. As shown in FIG. 1A, on a surface of the semiconductor wafer W as an object to be processed, a second underlayer 101 made of a metal (conductor) such as copper or the like, a first underlayer 102 made of SiCN or the like and an insulating layer 103 made of SiOC or the like are formed in that order from the bottom. Further, formed on the insulating layer 103 are a trench hard mask 104 made of TiN or the like and a via hole resist mask 105 made of a photoresist. The semiconductor wafer W in such state is loaded into the processing chamber 1 of the plasma processing apparatus 1.

Figure 1B:
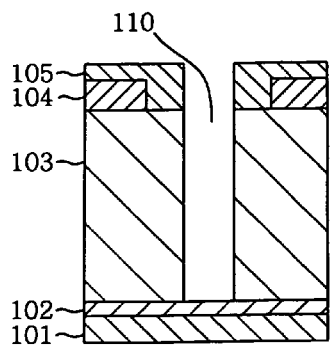
Figure 2:
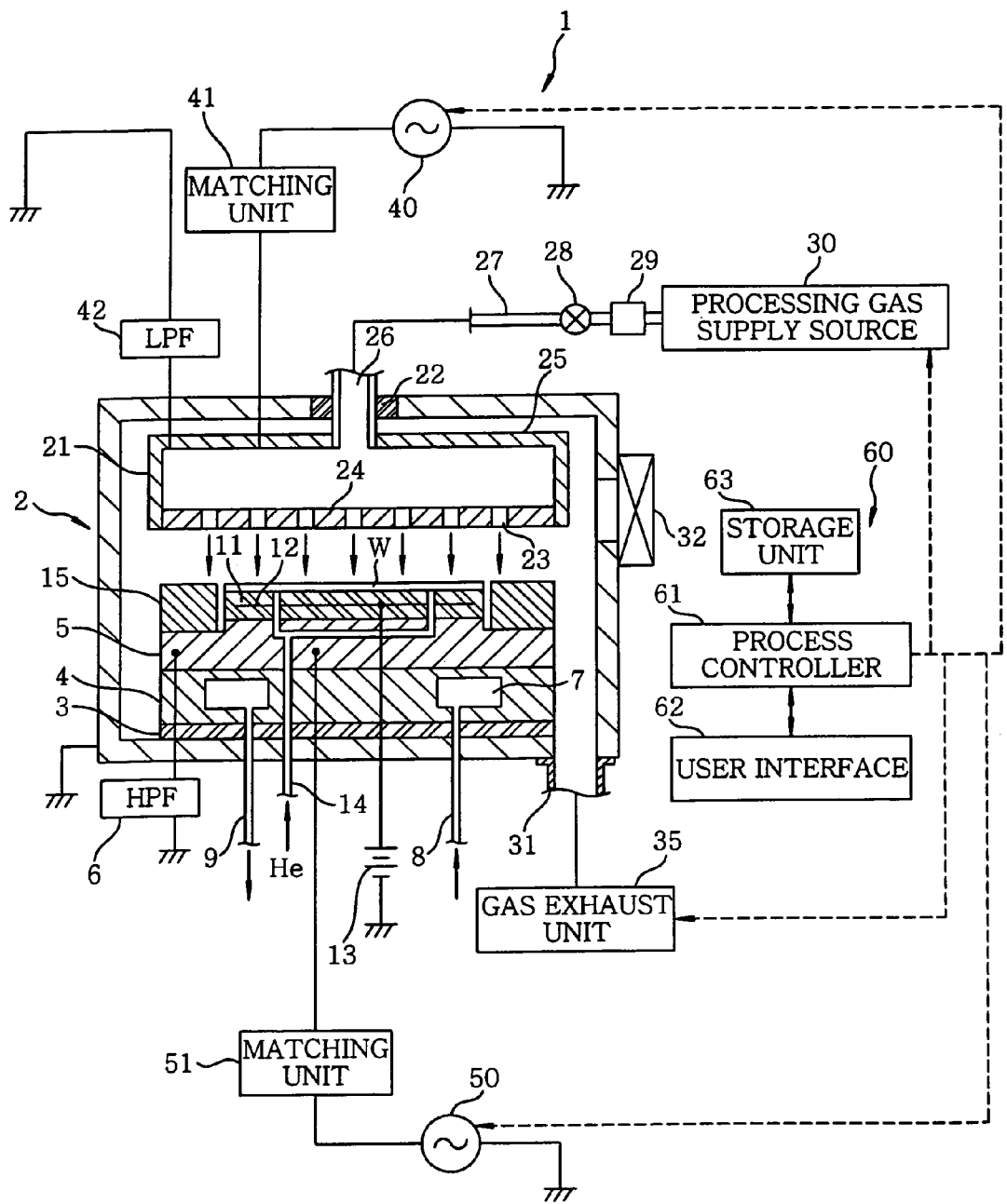
FIG. 2 illustrates a schematic configuration of an etching apparatus in accordance with a preferred embodiment of the present invention.

In the processing chamber 2, the insulating layer 103 is first plasma-etched by using a via hole resist mask 105 as a mask, thereby forming a via hole 110 illustrated in FIG. 1B. In the plasma etching, there may be used various plasma etching gases, e.g., a fluorine-based gas or the like, capable of plasma etching the insulating layer 103 (e.g., SiOC).

Figure 1C:
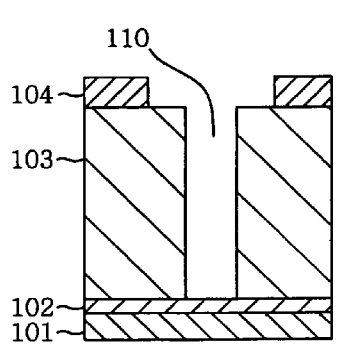

Next, an ashing process is performed at the state shown in FIG. 1B, so that a residual via hole resist mask 105 is removed as shown in FIG. 1C. The ashing process can employ $O_2$ gas or a mixed gas of $O_2$ and Ar.

Figure 1D:
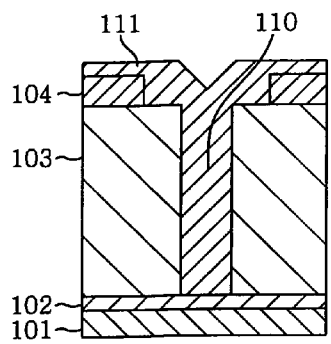
Figure 1E:
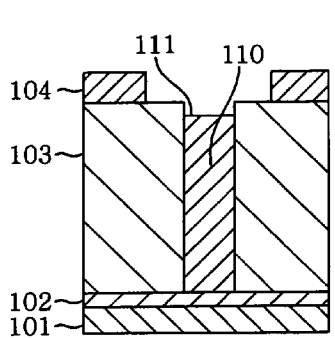

Thereafter, a protective film 111 having an organic material for protecting the first underlayer 102 disposed at the bottom of the via hole 110 is deposited as shown in FIG. 1D. Then, the protective film 111 deposited on area other than the inside of the via hole 110 is removed by an ashing process, as shown in FIG. 1E. In other words, the protective film 111 is formed by depositing the protective film 111 and then removing unnecessary portions thereof. In depositing the protective film 111, there can be employed various desposition gases, e.g., a $C_xF_y$ gas, a $C_xH_yF_z$ gas or the like (x, y and z being positive integers). In particular, there can be employed gases such as $CF_4$, $C_2F_6$, $C_3F_8$, $C_4F_8$, $C_3F_6$, $C_4F_6$, $C_5F_8$, $CH_4$, $C_2H_4$, $C_2H_2$, $CHF_3$, $C_2F_5$, $C_3F_7$, $CH_2F_2$, $CH_3F$ or the like and a mixed gas of these and other gases. Moreover, there can be employed $O_2$ gas or a mixed gas of $O_2$ and Ar in ashing the protective film 111.

Figure 1F:
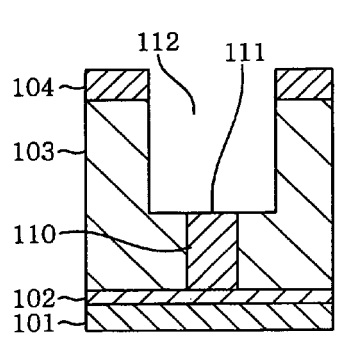
Figure 1G:
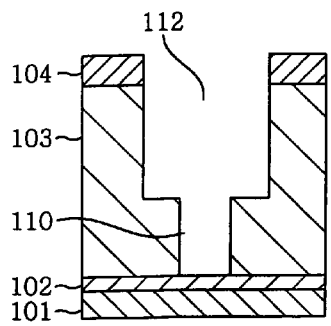

Next, a plasma etching is performed by using the trench hard mask 104 as a mask, thereby forming a trench 112 illustrated in FIG. 1F. At this time, the protective film 111 prevents the first underlayer 102 at the bottom of the via hole 110 from being etched. Thereafter, the protective film 111 remaining inside the via hole 110 is removed by an ashing process, as depicted in FIG. 1G. The plasma etching can employ various plasma etching gases, e.g., a fluorine-based gas or the like, capable of plasma etching the insulating layer 103 (e.g., SiOC). Further, $O_2$ gas or a mixed gas of $O_2$ and Ar can be used for ashing the protective film 111.

By performing the aforementioned series of processes, the via hole 110 and the trench 112 are formed on the semiconductor wafer W in the processing chamber 2. Then, the semiconductor wafer W is unloaded from the processing chamber 2. Next, a via contact and a wiring are formed by filling a conductor such as copper or the like into the via hole 110 and the trench 112 through a plating process, a CMP process or the like. The residual protective film 111 may be removed by performing another process after the semiconductor wafer W is unloaded from the processing chamber 2.

As described above, in this embodiment, the via hole 110 and the trench 112 can be formed by performing the aforementioned series of processes in a state where the semiconductor wafer W is accommodated in the processing chamber 2. Accordingly, it is possible to greatly reduce time required for manufacturing a semiconductor device in comparison with a conventional case where each of the processes is separately performed by transferring the semiconductor wafer W to different processing unit.

As an experiment for the present invention, the plasma processing apparatus 1 shown in FIG. 2 performs the aforementioned processes on the semiconductor wafer W having a structure described in FIG. 1 (photoresist of 100 nm, TiN of 50 nm, SiOC of 400 nm and SiCN of 50 nm) in accordance with recipes to be described hereinafter.

The following embodiment's processing recipes are read out from the storage unit 63 of the control unit 60 and then transmitted to the process controller 61. Then, the process controller 61 controls the respective units of the plasma processing apparatus 1 based on a control program, thereby performing the etching process in accordance with the process recipes.

(Via Hole Etching)

The via hole was etched under the following conditions:
Processing gas: $C_4F_8/N_2/Ar=6/180/500$ sccm
Pressure: 5.33 Pa (40 mTorr)
Power (upper electrode/lower electrode)=800/1700 W.

In this via hole etching process, the etching rate was 250 nm/min and the selectivity (SiOC etching rate/SiCN etching rate) was 10.

(Via Hole Resist Mask Ashing)

The via hole resist mask was ashed under the following conditions:
Processing gas: $O_2$=500 sccm
Pressure: 2.0 Pa (15 mTorr)
Power (upper electrode/lower electrode)=300/400 W In this via hole resist mask ashing process, the ashing rate was 500 nm/min.

(Protective Film Deposition)

The protective film was deposited under the following conditions:
Processing gas: $C_4F_8/Ar$=20/300 sccm
Pressure: 26.6 Pa (200 mTorr)
Power (upper electrode/lower electrode)=1000/0 W In this protective film deposition process, the deposition rate was 200 nm/min.

(Protective Film Ashing)

The protective film was washed under the following conditions:
Processing gas: $O_2$=500 sccm
Pressure: 2.0 Pa (15 mTorr)
Power (upper electrode/lower electrode)=300/400 W In this protective film ashing process, the ashing rate was 500 nm/min.

(Trench Etching)

The trench etching was performed under the following conditions:
Processing gas: $CF_4/Ar/O_2$=120/150/6 sccm
Pressure: 10.66 Pa (80 mTorr)
Power (upper electrode/lower electrode)=300/200 W In this trench etching process, the etching rate was 250 nm/min and the selectivity (SiOC etching rate/SiCN etching rate) was 3.

(Residual Protective Film Ashing)

The residual protective film was ashed under the following conditions:
Processing gas: $O_2$=500 sccm
Pressure: 2.0 Pa (15 mTorr)
Power (upper electrode/lower electrode)=300/400 W In this protective film ashing process, the ashing rate was 500 nm/min.

Figure 3A:
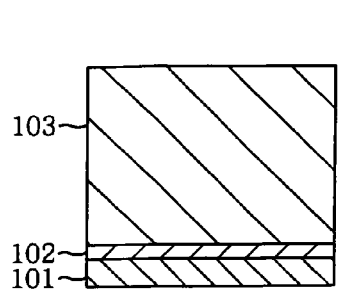
FIG. 3 describes a method for manufacturing a semiconductor wafer having a trench mask and a via mask.
Figure 3B:
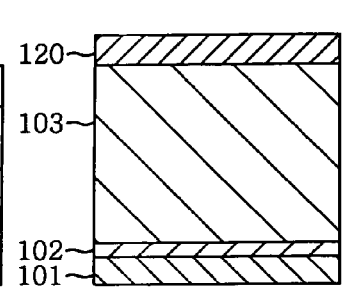

Hereinafter, a method for manufacturing a semiconductor wafer W having thereon a trench hard mask and a via hole resist mask will be described with reference to FIG. 3. First, as shown in FIG. 3A, the second underlayer 101 made of a metal (copper) or the like, the first underlayer 102 made of SiCN or the like and the insulating layer 103 formed of SiOC or the like are deposited on a surface of the semiconductor wafer W in that order from the bottom. Next, as illustrated in FIG. 3B, a hard mask material 120 such as TiN or the like is formed on the insulating film 103 by a CVD process or the like.

Figure 3C:
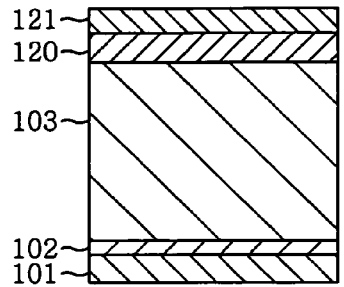
Figure 3D:
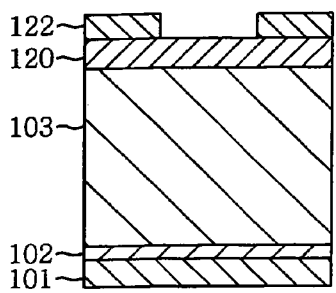

Then, as depicted in FIG. 3C, a photoresist 121 is coated on a surface of the hard mask 120. Thereafter, a resist mask 122 is formed by exposing and developing the photoresist 121, as illustrated in FIG. 3D.

Figure 3E:
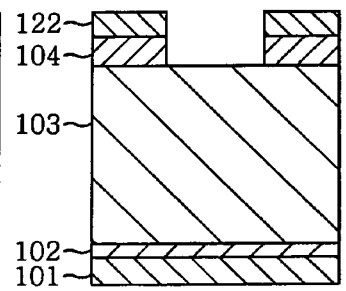
Figure 3F:
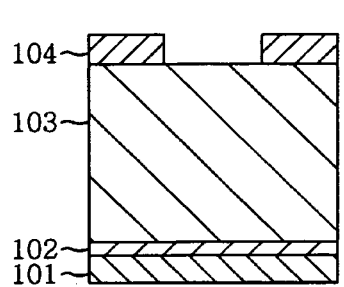

Next, the hard mask material 120 is etched by using the resist mask 122 as a mask, to form the trench hard mask 104, as shown in FIG. 3E. Then, as illustrated in FIG. 3F, the residual resist mask 122 is removed by the ashing process.

Figure 3G:
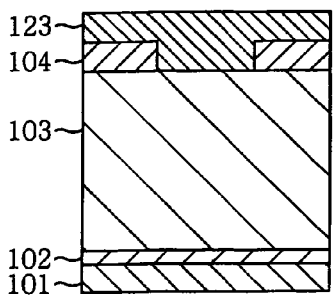
Figure 3H:
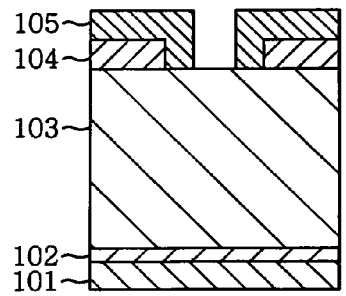

Thereafter, as depicted in FIG. 3G, a photoresist 123 is coated on the trench hard mask 104 and the insulating layer 103. Then, a via hole resist mask 105 is formed by exposing and developing the photoresist 123, as illustrated in FIG. 3H. By performing such processes, it is possible to manufacture the semiconductor wafer W having thereon the trench hard mask 104 and the via hole resist mask 105. Further, as described above, the semiconductor wafer W in such state is loaded into the processing chamber 2.

As described above, in accordance with the present inventions, it is possible to shorten time required for manufacturing a semiconductor device compared with a conventional case. Moreover, the present invention can be variously modified without being limited to the aforementioned embodiments. For example, the present invention can employ various plasma processing apparatuses without being limited to the parallel plate type wherein the high frequency powers are applied to the upper and the lower electrode, respectively as shown in FIG. 2. Besides, the present invention can use various semiconductor substrates as long as they have a substantially same structure as that of the semiconductor substrate illustrated in FIG. 1 without being limited to materials of the hard mask, the insulating layer and the like.

While the invention has been shown and described with respect to the preferred embodiments, it will be understood by those skilled in the art that various changes and modification may be made without departing from the scope of the invention as defined in the following claims.

What is claimed is:

1. A method for manufacturing a semiconductor device having a dual damascene structure, comprising the steps of:
    loading a semiconductor substrate formed by stacking a trench mask and a via hole resist mask on an insulating film into a processing chamber;
    forming a via hole by etching the insulating film through the via hole resist mask;
    removing the via hole resist mask by an ashing process;
    forming on an underlayer of the insulating film a protective film having an organic material for protecting the underlayer serving as a bottom of the via hole, the protective film also being formed over the trench mask;
    forming a trench by etching the insulating film through the trench mask; and
    unloading the semiconductor substrate from the processing chamber after the via hole forming step, the resist mask removing step, the protective film forming step and the trench forming step are completed in said processing chamber,
    wherein the via hole forming step, the resist mask removing step, the protective film forming step and the trench forming step are performed without removing the semiconductor substrate from said processing chamber.

2. The method of claim 1, wherein the via hole forming step, the resist mask removing step, the protective film forming step and the trench forming step are sequentially carried out in said processing chamber.

3. A method for manufacturing a semiconductor device having a dual damascene structure, comprising the steps of:

loading a semiconductor substrate formed by stacking a trench mask and a via hole resist mask on an insulating film into a processing chamber;

forming a via hole by etching the insulating film through the via hole resist mask;

removing the via hole resist mask by an ashing process;

forming on an underlayer of the insulating film a protective film having an organic material for protecting the underlayer serving as a bottom of the via hole, the protective film also being formed over the trench mask;

forming a trench by etching the insulating film through the trench mask;

removing the protective film by an ashing process; and unloading the semiconductor substrate from the processing chamber after the via hole forming step, the resist mask removing step, the protective film forming step, the trench forming step and the protective film removing step are completed in said processing chamber, wherein the via hole forming step, the resist mask removing step, the protective film forming step and the trench forming step are performed without removing the semiconductor substrate from said processing chamber.

4. The method of claim 3, wherein the via hole forming step, the resist mask removing step, the protective film forming step, the trench forming step and the protective film removing step are sequentially carried out in said processing chamber.

5. The method of claim 1, wherein the protective film forming step includes the steps of:
depositing the protective film; and
removing the protective film deposited on an area other than the inside of the via hole by an ashing process.

6. The method of claim 3, wherein the protective film forming step includes the steps of:
depositing the protective film; and
removing the protective film deposited on an area other than the inside of the via hole by an ashing process.

7. The method of claim 1, wherein the protective film is deposited by using $C_xF_y$ gas or $C_xH_yF_z$ gas.

8. The method of claim 3, wherein the protective film is deposited by using $C_xF_y$ gas or $C_xH_yF_z$ gas.

9. The method of claim 1, wherein the processing chamber has an upper and a lower electrodes facing each other, and high frequency powers are applicable to the upper and the lower electrodes, respectively.

10. The method of claim 3, wherein the processing chamber has an upper and a lower electrodes facing each other, and high frequency powers are applicable to the upper and the lower electrodes, respectively.

* * * * *